(12) United States Patent
Pan

(10) Patent No.: US 12,112,685 B2
(45) Date of Patent: Oct. 8, 2024

(54) GATE DRIVER ON ARRAY CIRCUIT AND DISPLAY PANEL

(71) Applicant: Wuhan China Star Optoelectronics Technology Co., Ltd., Hubei (CN)

(72) Inventor: You Pan, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,630

(22) PCT Filed: Jun. 1, 2021

(86) PCT No.: PCT/CN2021/097681
§ 371 (c)(1),
(2) Date: Nov. 24, 2022

(87) PCT Pub. No.: WO2022/241847
PCT Pub. Date: Nov. 24, 2022

(65) Prior Publication Data
US 2024/0054941 A1    Feb. 15, 2024

(30) Foreign Application Priority Data

May 18, 2021    (CN) .......................... 202110537844.X

(51) Int. Cl.
*G09G 3/30*    (2006.01)
(52) U.S. Cl.
CPC ....... *G09G 3/30* (2013.01); *G09G 2310/0267* (2013.01); *G09G 2310/08* (2013.01)

(58) Field of Classification Search
None
See application file for complete search history.

(56) References Cited

U.S. PATENT DOCUMENTS

| | | |
|---|---|---|
| 2013/0083885 A1 | 4/2013 | Lee et al. |
| 2016/0104449 A1* | 4/2016 | Huang ................. G11C 19/287 377/64 |
| 2021/0223902 A1* | 7/2021 | Wang .................. G06F 3/04184 |

FOREIGN PATENT DOCUMENTS

| | | |
|---|---|---|
| CN | 107591136 | 1/2018 |
| CN | 107610670 | 1/2018 |
| CN | 108806584 | 11/2018 |
| CN | 110782855 | 2/2020 |
| CN | 111179871 | 5/2020 |
| CN | 111477153 | 7/2020 |
| CN | 111627402 | 9/2020 |

* cited by examiner

*Primary Examiner* — Christopher J Kohlman

(57) ABSTRACT

A Gate Driver on Array (GOA) circuit and a display panel are provided. The GOA circuit includes a plurality of cascaded GOA units. An Nth stage GOA unit includes a pull-up control circuit, a pull-up output circuit and a scan direction control circuit. The scan direction control circuit can be controlled by the clock signal to realize the alternating forward and backward scanning. The output terminal of the scan direction control circuit is connected with the output terminal of the pull-up control circuit, and the output terminal potential of the pull-up control circuit can be alternately changed.

19 Claims, 3 Drawing Sheets

GATE DRIVER ON ARRAY CIRCUIT AND DISPLAY PANEL

RELATED APPLICATIONS

This application is a National Phase of PCT Patent Application No. PCT/CN2021/097681 having International filing date of Jun. 1, 2021, which claims the benefit of priority of China Patent Application No. 202110537844.X filed on May 18, 2021. The contents of the above applications are all incorporated by reference as if fully set forth herein in their entirety.

FIELD AND BACKGROUND OF THE INVENTION

The present disclosure relates to a display technology, and more particularly, to a Gate Driver On Array (GOA) circuit and a display panel.

The gate driver on array (GOA) technique is to integrate the gate driver circuits in the array substrate of the display panel to drive the line by line. In this way, the area of the gate driver circuits could be saved and thus the manufacturing cost could be reduced and the narrow side frame design could be realized. This design has been adopted in many types of displays.

However, current leakage on a pull-up node in the GOA circuit easily causes the operation of the GOA circuit to fail. At the same time, the pull-up node in the gate drive circuit maintains the same potential for a long period of time, which causes the pull-up node to be subjected to long-term stress, which reduces the reliability of the GOA circuit.

SUMMARY OF THE INVENTION

Technical Problem

One objective of an embodiment of the present disclosure is to provide a GOA circuit, which could reduce the leakage currents and raise the stability of the GOA circuit.

Technical Solution

According a first aspect of the present disclosure, a Gate Driver on Array (GOA) circuit includes a plurality of cascaded GOA units. An Nth stage GOA unit includes: a high voltage level line, configured to transmit high voltage level signal; an Nth stage scan line, configured to transmit an Nth stage scan signal; a first transistor, having a first electrode coupled to the high voltage level line; a second transistor, having a first electrode coupled to the high voltage level line; and a third transistor, having a gate coupled to a second electrode of the first transistor and a second electrode of the second transistor, and a first electrode coupled to the Nth stage scan line.

Optionally, the Nth stage GOA unit further comprises: a first clock line, configured to transmit a first clock signal; a second clock line, configured to transmit a second clock signal; a fourth transistor, having a first electrode coupled to the first clock line; a fifth transistor, having a first electrode coupled to a second electrode of the fourth transistor, and a second electrode coupled to the second electrode of the first transistor; a sixth clock line, having a gate and a first electrode coupled to the second clock signal; and a seventh transistor, having a first electrode coupled to a second electrode of the sixth transistor, and a second electrode coupled to the second electrode of the second transistor.

Optionally, the Nth stage GOA unit further comprises: a low voltage level line, configured to transmit a low voltage level signal; an eighth transistor, having a first electrode coupled to the high voltage level line; a ninth transistor, having a gate coupled to a second electrode of the eighth transistor, a first electrode coupled to the low voltage level line, and a second electrode coupled to the Nth stage scan line; and a tenth transistor, having a gate coupled to the second electrode of the first transistor, a first electrode coupled to the low voltage level signal, and a second electrode coupled to the gate of the ninth transistor.

Optionally, the Nth stage GOA unit further comprises: an eleventh transistor, having a first electrode coupled to the low voltage level line, a second electrode coupled to the second electrode of the first transistor, and a gate coupled to the second of the tenth transistor.

Optionally, the Nth stage GOA unit further comprises: a twelfth transistor, having a first electrode coupled to the low voltage level line, and a second electrode coupled to the second electrode of the first transistor.

Optionally, the Nth stage GOA unit further comprises: a first scan line, coupled to the gate of the first transistor and configured to transmit a first scan signal; a second scan line, coupled to the gate of the second transistor and configured to transmit a second scan signal; a forward scan control line, coupled to a gate of the fifth transistor and configured to transmit a forward scan control signal; a backward scan control line, coupled to a gate of the seventh transistor and configured to transmit a backward scan control signal; a third clock line, coupled to a second electrode of the third transistor and configured to transmit a third clock signal; and a fourth clock line, coupled to a gate of the eighth transistor and a gate of the twelfth transistor, and configured to transmit a fourth clock signal.

Optionally, the Nth stage GOA unit further comprises: a thirteenth transistor, having a gate coupled to the high voltage level line, a first electrode coupled to a second electrode of the first transistor, and a second electrode coupled to the gate of the seventh transistor.

According a second aspect of the present disclosure, a Gate Driver on Array (GOA) circuit includes a plurality of cascaded GOA units. An Nth stage GOA unit includes: a pull-up control circuit, having an input end fed with a high voltage level signal, and a control end fed with an (N−2)th stage scan signal and an (N+2)th stage scan signal; a pull-up output circuit, having a control end coupled to an output end of the pull-up control circuit, an input end coupled to an Nth stage clock signal, and an output end outputting coupled to an Nth stage scan signal; and a scan direction control circuit, having an input end fed with an (N−2)th stage clock signal and an (N+2)th stage clock signal, an output end coupled to the control end of the pull-up control circuit, and a control end fed with a forward scan control signal, a backward scan control signal, the (N−2)th stage clock signal.

Optionally, the Nth stage GOA unit further comprises: a pull-down control circuit, having an input end fed with the high voltage level signal, and a control end fed with an (N+4)th stage clock signal; and a pull-down output circuit, having a control end coupled to the control end of the pull-down control circuit, an input end fed with a low voltage level signal, and an output end coupled to the output end of the pull-up output circuit.

Optionally, the Nth stage GOA unit further comprises: a first pull-down circuit, having an input end fed with the low voltage level signal, a control end coupled to an output end of the pull-up control circuit, and an output end coupled to an output end of the pull-down control circuit.

Optionally, the Nth stage GOA unit further comprises: a second pull-down circuit, having an input end fed with the low voltage level signal, an output end coupled to the output end of the pull-up control circuit, and a control end coupled to the output end of the pull-down control circuit.

Optionally, the Nth stage GOA unit further comprises: a third pull-down circuit, having an input end fed with the low voltage level signal, an output end coupled to the output end of the pull-up control circuit, and a control end coupled to the (N+4)th stage clock signal.

Optionally, the Nth stage GOA unit further comprises: a first voltage stabilizing circuit, coupled to the output end of the pull-up control circuit and fed with the low voltage level signal; and a second voltage stabilizing circuit, coupled to the output end of the pull-down control circuit and fed with the low voltage level signal.

Optionally, the Nth stage GOA unit further comprises: a third voltage stabilizing circuit, having an input end coupled to the output end of the pull-up control circuit, a control end fed with the high voltage level signal, and an output end coupled to the output end of the pull-up output circuit; or a global pull-up circuit, having an input end fed with an global pull-up signal, a control end fed with the global pull-up signal, and an output end coupled to the output end of pull-up output circuit; or a global pull-down circuit, having an input end fed with the low voltage level signal, a control end fed with the global pull-down signal, and an output end coupled to the output end of pull-up output circuit.

Optionally, the pull-up control circuit comprises: a first thin film transistor, having a first electrode fed with the high voltage level signal, and a gate fed with the (N−2)th stage scan signal; and a second thin film transistor, having a first electrode fed with the high voltage level signal, a gate fed with the (N+2)th stage scan signal, and a second electrode coupled to a second electrode of the first thin film transistor and the output end of the scan direction control circuit.

Optionally, the scan direction control circuit comprises: a forward scan control circuit, having an input end fed with the (N+2)th stage clock signal, and a control end fed with the (N+2)th stage clock signal and the forward scan control signal; and a backward scan control circuit, having an input end fed with the (N−2)th stage clock signal, a control end fed with the (N−2)th stage clock signal and the backward scan control signal, and an output end coupled to an output end of the forward scan control circuit and the control end of the pull-up control circuit.

Optionally, the forward scan control circuit comprises: a third thin film transistor, having a first electrode fed with the (N+2)th stage clock signal, and a gate fed with the (N+2)th stage clock signal; and a fourth thin film transistor, having a first electrode coupled to a second electrode of the third thin film transistor, a gate fed with the forward scan control circuit, and a second electrode coupled to the output end of the pull-up control circuit. The backward scan control circuit comprises: a fifth thin film transistor, having a first electrode fed with the (N−2)th stage clock signal, and a gate fed with the (N−2)th stage clock signal; and a sixth thin film transistor, having a first electrode coupled to a second electrode of the fifth thin film transistor, a gate fed with the backward scan control circuit, and a second electrode coupled to the output end of the pull-up control circuit.

Optionally, the pull-up output circuit comprises: a seventh thin film transistor, having a gate coupled to the second electrode of the fourth thin film transistor or the second electrode of the sixth thin film transistor, a first electrode fed with an Nth clock signal, and a second electrode outputting the Nth scan signal.

According a third aspect of the present disclosure, a display panel includes the GOA circuit as mentioned above.

Optionally, a working stage of the display panel includes a row scanning stage that includes a touch scanning stage; and the GOA circuit works in the row scanning stage and the touch scanning stage in a time-sharing manner.

Beneficial Effect

The GOA circuit of the present disclosure is fed with a high-potential signal through the input end of the pull-up control circuit, which can alleviate the failure of the GOA circuit, thereby improving the reliability of the GOA circuit. At the same time, the scanning direction control circuit can be controlled by the clock signal to realize the alternating forward and backward scanning. Since the output end of the scanning direction control circuit is connected with the output end of the pull-up control circuit, the potential applied on the output end of the pull-up control circuit can be alternately changed to relieve the stress caused by the output end of the pull-up control circuit maintaining the same potential for a long time, further improving the reliability of the GOA circuit.

DESCRIPTION OF SPECIFIC EMBODIMENTS OF THE INVENTION

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Figure 1:
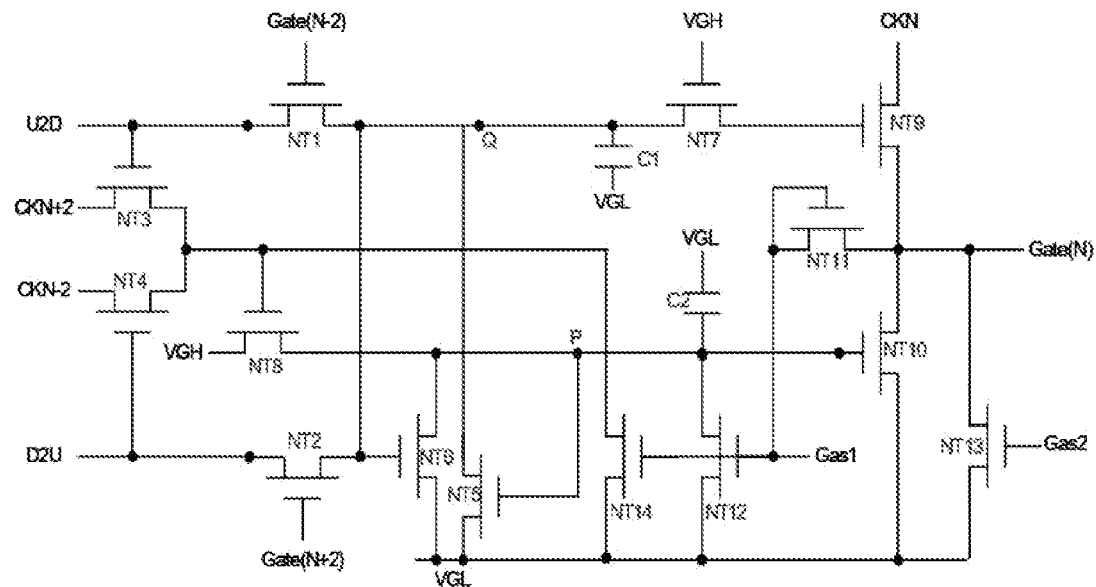
FIG. 1 illustrates a circuit diagram of a GOA circuit according to a first embodiment of the present disclosure.

In one of the embodiments, as shown in FIG. 1, this embodiment provides a Gate Driver on Array (GOA) circuit, which includes a plurality of cascaded GOA units. In one of the GOA units, the forward scan control signal U2D is fed to a first electrode of a transistor NT1 and a gate of a transistor NT3. The gate of the transistor NT1 is controlled by a gate scan signal Gate (N−2). A second electrode of the transistor NT1 and a first electrode of a transistor NT7, a first terminal of a capacitor C1, a first electrode of a transistor NT2, and a first electrode of a transistor NT5 are connected at a pull-up node Q. A second end of the capacitor C1 is fed with a low voltage level signal VGL. The gate of the transistor NT7 is fed with the high voltage level signal VGH.

The second electrode of the transistor NT7 and the gate of the transistor NT9 are connected. The first electrode of the transistor NT9 is fed with a clock signal CKN. The second electrode of the transistor NT9, the first electrode of the transistor NT10, the second electrode of the transistors NT11, and the first electrode of the transistors NT13 are connected to output the gate scan signal Gate (N). The first electrode of the transistor NT3 is fed with a clock signal CKN+2. The second electrode of the transistor NT3, the second electrode of the transistor NT4, the gate of the transistor NT8, and the first electrode of the transistor NT14 are connected. The first electrode of the transistor NT4 is fed with the clock signal CKN−2. The first electrode of the transistor NT8 is fed with the high voltage level signal VGH. The second electrode of the transistor NT8, the first electrode of the transistor NT6, the gate of the transistor NT5, the second end of the capacitor C2, the first electrode of the transistor NT12, and the gate of the transistor NT10 are connected at a pull-down node P. A first end of the capacitor C2 is fed with the low voltage level signal VGL. The backward scan control signal D2U is applied on and the gate of the transistor NT4 and the first electrode of the transistor NT2. The second electrode of the transistor NT2 and the gate of the transistor NT6 is connected at the pull-up node Q. The low signal VGL is applied on the second electrodes of the transistor NT5, the transistor NT6, the transistor NT12, the transistor NT14, the transistor NT10 and the transistors NT13. The first global control signal Gas1 is applied on the gates of the transistor NT12, the transistor NT14, and the transistor NT11, and the first electrode of the transistor NT11. The second global control signal Gas2 is applied on the gate of the transistor NT13. The gate of the transistor NT2 is fed with the scan signal Gate (N+2).

Based on the above description, in the above GOA circuit, a current leakage path exists at the pull-up node Q. During forward scanning, the transistor NT1 is under a severe Negative-Voltage and Bias-Temperature Stress (NBTS) state. In this NBTS state, because voltage Vds across the drain and the source of the transistor NT1 is equal to a voltage difference between of the high voltage level signal VGH and the low voltage level signal VGL for a long while, a negative drift of the threshold voltage Vth of the transistor NT1 or a rise of turn-off current I-off of the transistor NT1 is induced. During a Touch Panel (TP) suspending period that the GOA circuit needs to realize the function of suspending scanning, a potential of the pull-up node Q is held at the high voltage level signal VGH and a potential of the pull-down node P is held at low voltage level signal VGL. During forward scanning, the first electrode of the transistor NT1 is fed with the forward scan control signal U2D that keeps at the high potential consistent with the potential of the high voltage level signal VGH, preventing the transistor NT1 from current leakage through the pull-up node Q. However, during the backward scanning, the forward scan control signal U2D transitions to the low voltage level consistent with the potential of the low voltage level signal VGL. At this time, a leakage path of the pull-up node Q is formed through the transistor NT1. Therefore, the quasi potential of the pull-up node Q and the potential of the high voltage level signal VGH is pulled down, causing the GOA circuit disabling during the TP suspending period, and inducing a GOA circuit a technical question about the reliability.

Figure 2:
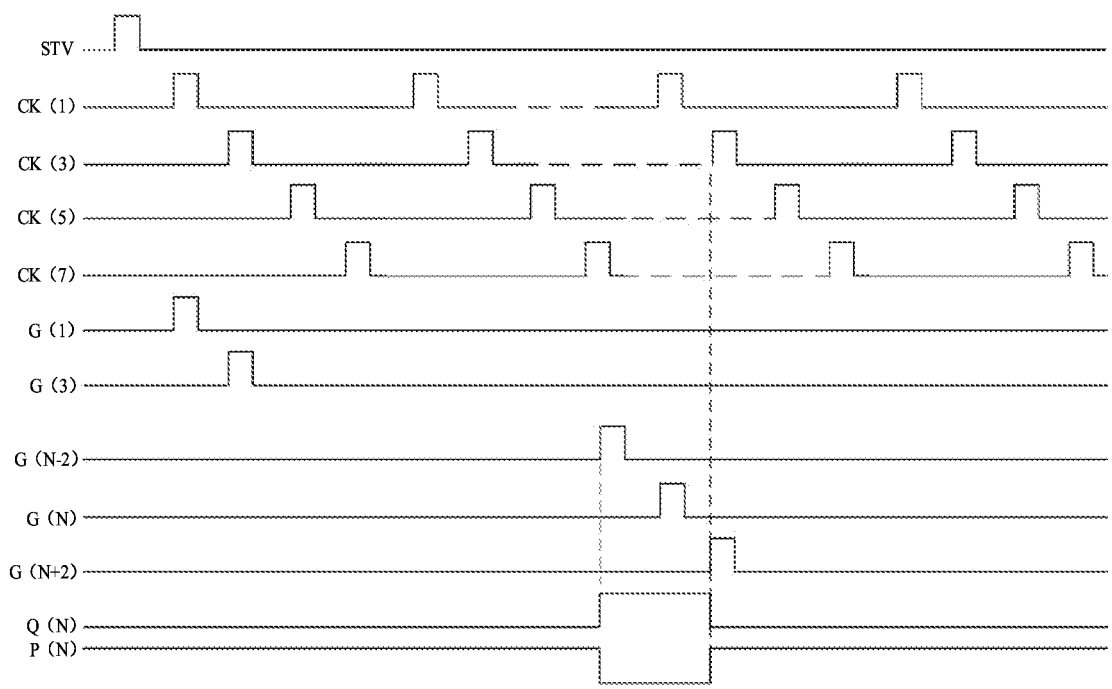
FIG. 2 illustrates a timing diagram of signals applied on the GOA circuit shown in FIG. 1.
Figure 3:
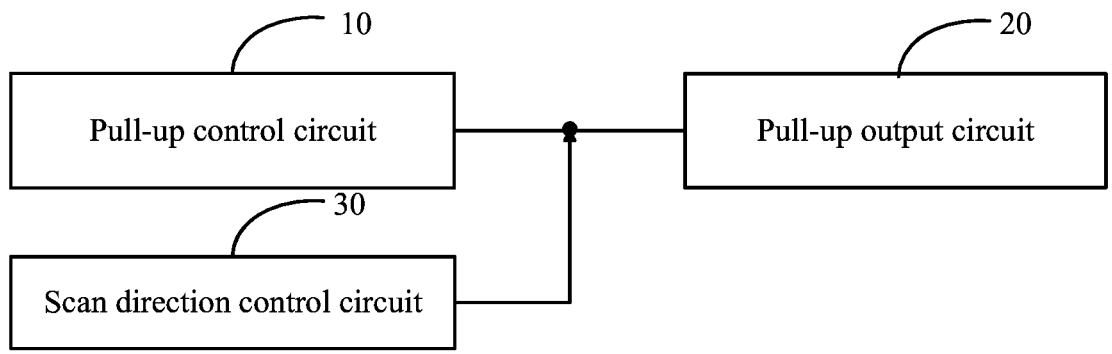
FIG. 3 illustrates a circuit diagram of a GOA circuit according to a second embodiment of the present disclosure.

As shown in FIG. 2, under the control of the initial signal STV and clock signals, e.g. a clock signal CK(1), a clock signal CK(3), a clock signal CK(5), and a clock signal CK(7), the GOA circuit can generate a corresponding scan signal, for example, the scan signal G(1), a scan signal G(3), a scan signal G(N−2), a scan signal G(N) and the scan signal G(N+2). A change of the potentials of the Nth-stage pull-up node Q(N) and Nth-stage pull-down node P(N) are described in the following paragraphs.

Another technical problem of the GOA circuit as to reliability is that: for Nth GOA unit of the GOA circuit, during a time period from a rising edge of the scan signal G(N−2) to a rising edge of the scan signal G (N+2), because the node Q(N) of the Nth GOA unit is maintained at the potential of the high voltage level signal VGH; the rest of the time the node Q(N) of the Nth GOA unit is maintained at the potential of the low voltage level signal VGL, resulting in the transistor NT6 under NBTS for a long time.

During a time period from a rising edge of the scan signal G(N−2) to a rising edge of the scan signal G (N+2), because the node P(N) of the Nth GOA unit is maintained at the potential of the low voltage level signal VGL; the rest of the time the node P(N) of the Nth GOA unit is maintained at the potential of the high voltage level signal VGH, resulting in the transistor NT5 under PBTS (Positive-Bias-voltage and Temperature Stress) for a long time.

Referring to FIG. 3 to FIG. 6, a Gate Driver on Array (GOA) circuit includes a plurality of cascaded GOA units. An Nth stage GOA unit includes a pull-up control circuit 10, a pull-up output circuit 20, and a scan direction control circuit 30. The pull-up control circuit 10 includes having an input end fed with a high voltage level signal VGH, and a control end fed with an (N−2)th stage scan signal G(N−2) and an (N+2)th stage scan signal G(N+2). The pull-up output circuit 20 includes a control end coupled to an output end of the pull-up control circuit 10, an input end coupled to an Nth stage clock signal CK(N), and an output end outputting coupled to an Nth stage scan signal G(N). The scan direction control circuit 30 includes an input end fed with an (N−2)th stage clock signal CK(N−2) and an (N+2)th stage clock signal CK(N+2), an output end coupled to the control end of the pull-up control circuit 10, and a control end fed with a forward scan control signal U2D, a backward scan control signal D2U, the (N−2)th stage clock signal CK(N−2) and the (N+2)th stage clock signal CK(N+2).

It will be appreciated that, by the pull-up control circuit 10 of which the input end fed with the high voltage level signal VGH, the GOA circuit can prevent from being disabled, thereby improving reliability of the GOA circuit. Meanwhile, the scan direction control circuit 30 alternately controls the forward and backward scanning directions in response to the clock signal. Because the output end of the pull-up control circuit 10 connects to the output end of the scan direction control circuit 30, potential on the output end of the pull-up control circuit 10 alternatively changes can ease stress applied on the output end of the pull-up control circuit 10, which is caused by the same potential on the output end of the pull-up control circuit 10 for a long period of time. This can enhance reliability of the GOA circuit.

It is noted that N may be a positive integer, e.g., 1, 2, 3, 8 and the like.

Figure 4:
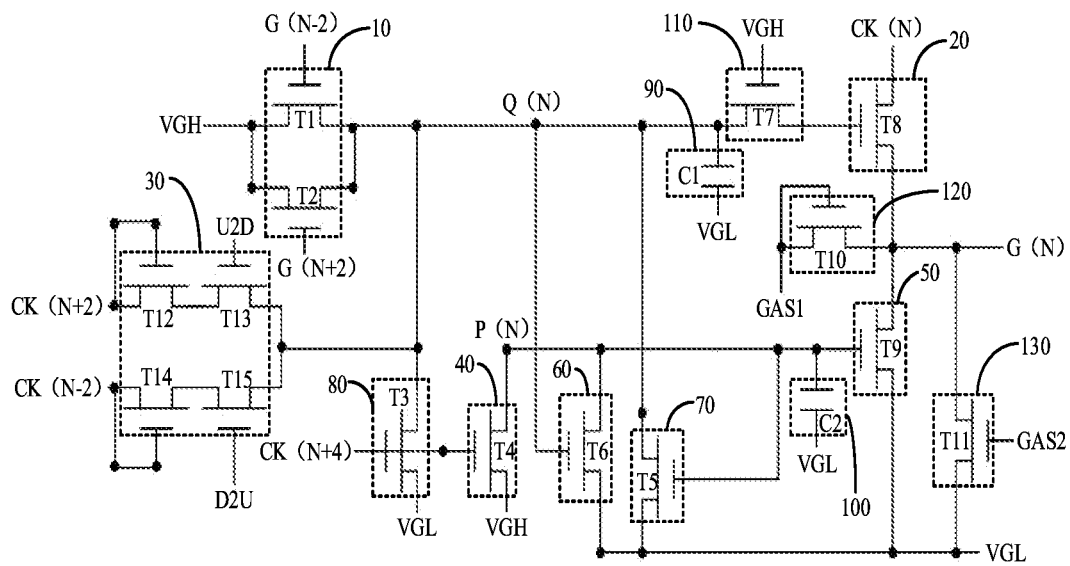
FIG. 4 illustrates a circuit diagram of a GOA circuit according to a third embodiment of the present disclosure.

As shown in FIG. 4, in one of the embodiments, the pull-up control circuit 10 includes a first thin film transistor T1 and a second thin film transistor T2. The first thin film transistor T1 includes a first electrode fed with the high voltage level signal VGH, and a gate fed with the (N−2)th stage scan signal G(N−2). The second thin film transistor T2 includes a first electrode fed with the high voltage level signal VGH, a gate fed with the (N+2)th stage scan signal G(N+2), and a second electrode coupled to a second electrode of the first thin film transistor T1 and the output end of the scan direction control circuit 30.

It is noted that, since the first electrodes of the first thin film transistor T1 and the second thin film transistor T2 are fed with the high voltage level signal VGH, the potential at the node Q(N) will not reduce caused by the current leakage through the first thin film transistor T1 and/or the second thin film transistor T2.

The node Q (N) may be one of the output end of the pull-up control circuit 10, the output end of the scan direction control circuit 30, the control end of the pull-up output circuit 20, and the input end of the third stabilizing circuit 110.

In one embodiment, the scanning direction control circuit 30 includes a forward scan control circuit and a backward scan control circuit. The forward scan control circuit includes an input end fed with the (N+2)th stage clock signal CK(N+2), and a control end fed with the (N+2)th stage clock signal CK(N+2) and the forward scan control signal U2D. The backward scan control circuit includes an input end fed with the (N−2)th stage clock signal CK(N−2), a control end fed with the (N−2)th stage clock signal CK(N−2) and the backward scan control signal D2U, and an output end coupled to an output end of the forward scan control circuit and the control end of the pull-up control circuit 10.

In this embodiment, the Nth stage GOA unit can be driven to perform forward scanning in response to the (N+2)th stage clock signal CK(N+2), and can be driven to perform backward scanning in response to the (N−2)th stage clock signal CK(N−2). Correspondingly, the (N+2)th stage clock signal CK(N+2) and the (N−2)th stage clock signal CK(N−2) will be transmitted to the node Q (N), so that the potential of the node Q (N) can be transitioned with the corresponding clock signal, which can alleviate the reliability problem caused by the stress or temperature stress of the node Q (N) that needs to bear the same potential for a long time.

As shown in FIG. 4, in one embodiment, the forward scanning control circuit includes the third thin film transistor T12 and the fourth thin film transistor T13. The third thin film transistor T12 includes a first electrode fed with the (N+2)th stage clock signal CK(N+2), and a gate fed with the (N+2)th stage clock signal CK(N+2). The fourth thin film transistor T13 includes a first electrode coupled to a second electrode of the third thin film transistor T12, a gate fed with the forward scan control signal U2D, and a second electrode coupled to the output end of the pull-up control circuit 10.

In one embodiment, the backward scan control circuit includes a fifth thin film transistor T14 and a sixth thin film transistor T15. The fifth thin film transistor T14 includes a first electrode fed with the (N−2)th stage clock signal CK(N−2), and a gate fed with the (N−2)th stage clock signal CK(N−2). The sixth thin film transistor T15 includes a first electrode coupled to a second electrode of the fifth thin film transistor T14, a gate fed with the backward scan control signal D2U, and a second electrode coupled to the output end of the pull-up control circuit 10.

In one embodiment, the pull-up output circuit 20 comprises a seventh thin film transistor T8. The seventh thin film transistor T8 includes a gate coupled to the second electrode of the fourth thin film transistor T1, a first electrode fed with an Nth stage clock signal CK(N), and a second electrode outputting the Nth stage scan signal G(N−2).

In one embodiment, the Nth stage GOA unit further comprises a pull-down control circuit 40 and a pull-down output circuit 50. The pull-down control circuit 40 includes an input end fed with the high voltage level signal VGH, and a control end fed with an (N+4)th stage clock signal CK(N+4). The pull-down output circuit 50 includes a control end coupled to the control end of the pull-down control circuit 40, an input end fed with the low voltage level signal VGL, and an output end coupled to the output end of the pull-up output circuit 20.

It will be appreciated that, the control end of the pull-down output circuit 50 or the output end of the pull-down control circuit 40 serves as the node P(N).

The pull-down control circuit 40 includes an eighth thin film transistor T4. A gate of the eighth thin film transistor T4 is fed with the (N+4)th stage clock signal CK(N+4). A first electrode of the eighth thin film transistor T4 is fed with the high voltage level signal VGH supplied by the high voltage level line. A second electrode of the eighth thin film transistor T4 is connected to the node P(N).

The pull-down output circuit 50 includes a ninth thin film transistor T9, having a gate coupled to a second electrode of the eighth thin film transistor T4, a first electrode coupled to the low voltage level line to receive the low voltage level signal VGL, and a second electrode coupled to the second electrode of the seventh thin film transistor T8.

In one embodiment, the Nth stage GOA unit further comprises a first pull-down circuit 60. The first pull-down circuit 60 includes an input end fed with the low voltage level signal VGL, a control end coupled to an output end of the pull-up control circuit 10, and an output end coupled to an output end of the pull-down control circuit 40.

The first pull-down circuit 60 includes a tenth thin film transistor T6. The tenth thin film transistor T6 has a gate coupled to the second electrode of the first thin film transistor T1 and the second electrode of the second thin film transistor T2, a first electrode fed with the low voltage level signal VGL, and a second electrode coupled to the gate of the ninth thin film transistor T9 and the second electrode of the eighth thin film transistor T4.

In this embodiment, the Nth stage GOA unit can be driven to perform forward scanning in response to the (N+2)th stage clock signal CK(N+2), and can be driven to perform backward scanning in response to the (N−2)th stage clock signal CK(N−2). Correspondingly, the (N+2)th stage clock signal CK(N+2) and the (N−2)th stage clock signal CK(N−2) will be transmitted to the node Q (N), so that the potential of the node Q (N) can be transitioned with the corresponding clock signal, which can alleviate the reliability problem caused by the stress or temperature stress of the node Q (N) that needs to bear the same potential for a long time.

When the tenth thin film transistor T6 is turned in response to the potential of the node Q(N), the node P (N) is pulled down to the low voltage level signal VGL. Upon a condition that the tenth thin film transistor T6 is an N-channel type thin film transistor, the potential of the node Q (N) can be pull down the potential of the node P (N) to the low voltage level signal VGL. Therefore, as the potential of the node Q (N) changes, the node P(N) will also be adjusted to the corresponding potential, which can alleviate the situation that the potential of node P (N) remains at the same potential for a long time. Accordingly, the tenth thin film transistor T6 will not be under a long-term NBTS condition, which can improve the reliability of the GOA circuit.

In one embodiment, the Nth stage GOA unit further comprises a second pull-down circuit 70. The second pull-down circuit 70 has an input end fed with the low voltage level signal VGL, an output end coupled to the output end of the pull-up control circuit 10, and a control end coupled to the output end of the pull-down control circuit 40.

The second pull-down circuit 70 includes an eleventh thin film transistor T5. The eleventh thin film transistor T5 has a first electrode coupled to the low voltage level line to receive the low voltage level signal VGL, a second electrode coupled to the second electrode of the first thin film transistor T1 and the second electrode of the second thin film transistor T2, and a gate coupled to the second of the eighth thin film transistor T4.

When the eleventh thin film transistor T5 is turned in response to the potential of the node P(N), the node Q(N) is pulled down to the low voltage level signal VGL. Upon a condition that the eleventh thin film transistor T5 is an N-channel type thin film transistor, the potential of the node P(N) can be pull down the potential of the node Q(N) to the low voltage level signal VGL. Therefore, as the potential of the node P(N) changes, the node Q(N) will also be adjusted to the corresponding potential, which can alleviate the situation that the potential of node Q(N) remains at the same potential for a long time. Accordingly, the eleventh thin film transistor T5 will not be under a long-term NBTS condition, which can improve the reliability of the GOA circuit.

In one embodiment, the Nth stage GOA unit further comprises a third pull-down circuit 80. The third pull-down circuit 80 includes an input end fed with the low voltage level signal VGL, an output end coupled to the output end of the pull-up control circuit 10, and a control end coupled to the (N+4)th stage clock signal CK(N+4).

In one embodiment, the third pull-down circuit 80 includes a twelfth thin film transistor T3. The twelfth thin film transistor T3 includes a first electrode fed with the low voltage level signal VGL from the low voltage level line, a gate coupled to the (N+4)th stage clock signal CK(N+4), and a second electrode coupled to the second electrode of the first thin film transistor T1, the second electrode of the second thin film transistor T2, the second electrode of the fourth thin film transistor T13, and the second electrode of the sixth thin film transistor T15.

In one embodiment, the Nth stage GOA unit further comprises a first voltage stabilizing circuit 90 and/or a second voltage stabilizing circuit 100. The first voltage stabilizing circuit 90 is coupled to the output end of the pull-up control circuit 10 and fed with the low voltage level signal VGL. The second voltage stabilizing circuit 100 is coupled to the output end of the pull-down control circuit 40 and fed with the low voltage level signal VGL.

In one embodiment, the first voltage stabilizing circuit 90 include a first capacitor C1. The first capacitor C1 is coupled to the second electrode of the first thin film transistor T1 and the second electrode of the second thin film transistor T2. The first capacitor C1 is fed with the low voltage level signal VGL.

It is understandable that the first voltage stabilizing module 90 is beneficial to stabilize the potential of the node Q(N).

In one embodiment, the second voltage stabilizing module 100 includes a second capacitor C2. The second capacitor C2 is coupled to the second electrode of the eighth thin film transistor T4. The second capacitor C2 is fed with the low voltage level signal VGL.

It can be understood that the second voltage stabilizing module 100 is beneficial to stabilize the potential of the node P(N).

In one embodiment, the Nth stage GOA unit further comprises a third voltage stabilizing circuit 110, a global pull-up circuit 120, and a global pull-down circuit 130. The third voltage stabilizing circuit 110 includes an input end coupled to the output end of the pull-up control circuit 10, a control end fed with the high voltage level signal VGH, and an output end coupled to the output end of the pull-up output circuit 20. The global pull-up circuit 120 includes an input end fed with a global pull-up signal GAS1, a control end fed with the global pull-up signal GAS1, and an output end coupled to the output end of pull-up output circuit 20. The global pull-down circuit 130 includes an input end fed with the low voltage level signal VGL, a control end fed with the global pull-down signal GAS2, and an output end coupled to the output end of pull-up output circuit 20.

The third voltage stabilizing circuit 110 includes a thirteenth thin film transistor T7. The thirteenth thin film transistor T7 has a gate fed with the high voltage level signal VGH from the high voltage level line, a first electrode coupled to the second electrode of the first thin film transistor T1 and the second electrode of the second thin film transistor T2, and a second electrode coupled to the gate of the seventh thin film transistor T8.

It will be appreciated that, when the potential on the first electrode and the second electrode of the thirteenth thin film transistor T7 are identical, the thirteenth thin film transistor T7 is cut off or turned off. Accordingly, the potential on the first electrode and/or the second electrode of the thirteenth thin film transistor T7 can be hold.

The global pull-up circuit 120 includes a fourteenth thin film transistor T10. The first electrode of the fourteenth thin film transistor T10 is fed with to the global pull-up signal GAS1. The second electrode the fourteenth thin film transistor T10 is coupled to the second electrode of the seventh thin film transistor T8. The gate of the fourteenth thin film transistor T10 is fed with the global pull-up signal GAS1.

The global pull-down circuit 130 includes a fifteenth thin film transistor T11. The first electrode of the fifteenth thin film transistor T10 is fed with to the low voltage level signal VGL. The second electrode the fifteenth thin film transistor T11 is coupled to the second electrode of the seventh thin film transistor T8. The gate of the fifteenth thin film transistor T11 is fed with the global pull-down signal GAS2.

Figure 5:
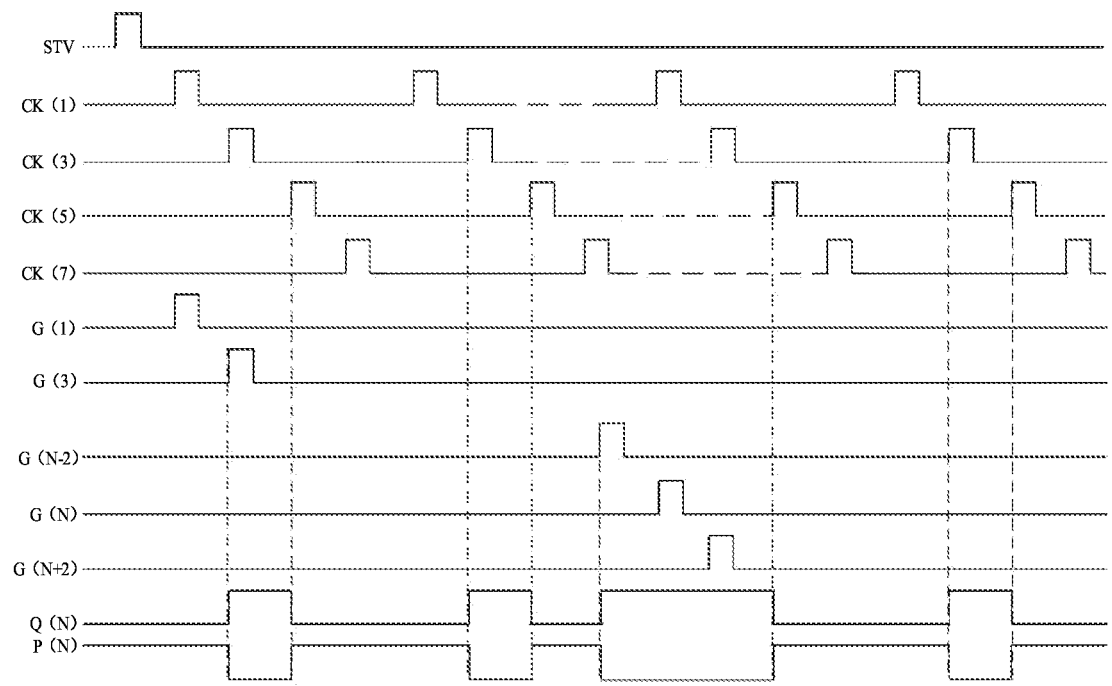
FIG. 5 illustrates a timing diagram of signals applied on the GOA circuit shown in FIG. 4.

As illustrated in FIG. 5, in some embodiments, the GOA circuit may generate a corresponding scan signal according to an initial signal STV and the clock signal. The clock signal may be, but is not limited to, the first clock signal CK(1), the third clock signal CK(3), the fifth clock signal CK(5), the seventh clock signal CK(7). For example, the scan signal may be, but is not limited to the first stage scan signal G(1), third stage scan signal G (3), the (N−2)th stage scan signal G(N−2), the Nth stage scan signal G(N) and the (N+2)th stage scan signal G(N+2).

The potential of node Q(N) and node P(N) can be stated as follows:

For example, during a time period between from a rising edge of the third stage scan signal G(3) to a rising edge of the first pulse of the fifth clock signal CK (5), the potential of the node Q (N) keeps at the high voltage level while the potential of the node P (N) is maintained at a low voltage level.

For example, during a time period between from a rising edge of the second pulse of the third clock signal CK (3) to a rising edge of the second pulse of the fifth clock signal CK (5), the potential of the node Q (N) keeps at the high voltage level while the potential of the node P (N) is maintained at a low voltage level.

For example, during a time period between from a rising edge of the (N−2)th stage scan signal G(N−2) to a rising edge of the third pulse of the fifth clock signal CK (5), the potential of the node Q (N) keeps at the high voltage level while the potential of the node P (N) is maintained at a low voltage level.

As another example, during a time period between from a rising edge of one of pulses of the third clock signal CK (3) to a rising edge of one of the pulses of the fifth clock signal CK (5), the potential of the node Q (N) keeps at the high voltage level while the potential of the node P (N) is maintained at a low voltage level.

There will always be a corresponding low voltage level between two adjacent high voltage levels at the node Q (N). Correspondingly there will always be a corresponding high voltage level between two adjacent low voltage levels at the node P (N).

Accordingly, the potential of any one of the node Q(N) and the node P(N) can be high voltage level and low voltage level alternated, and the frequency of alternating has also been increased, which can improve the GOA circuit reliability.

As shown in FIG. 4, a Gate Driver on Array (GOA) circuit includes a plurality of cascaded GOA units. The Nth stage GOA unit includes a high voltage level line, an Nth stage scan line, a first transistor, a second transistor, and a third transistor. The high voltage level line is configured to transmit high voltage level signal. The Nth stage scan line is configured to transmit an Nth stage scan signal. The first transistor has a first electrode coupled to the high voltage level line. The second transistor has a first electrode coupled to the high voltage level line. The third transistor has a gate coupled to a second electrode of the first transistor and a second electrode of the second transistor, and a first electrode coupled to the Nth stage scan line.

Since the first electrodes of the first transistor and the second transistor are fed with the high voltage level line, current leakage at the gate of the third transistor can be reduced or prevented, easing the GOA circuit work failure problem, and upgrading the GOA circuit reliability.

It should be noted that, referring to FIG. 4, the first transistor indicates the first thin film transistor T1, the second transistor indicates the second thin film transistor T2, and the third transistor indicates the seventh thin film transistor T8.

In one embodiment, the Nth stage GOA unit further comprises a first clock line, a second clock line, a fourth transistor, a fifth transistor, a sixth transistor, a seventh transistor. The first clock line is configured to transmit a first clock signal. The second clock line is configured to transmit a second clock signal. The fourth transistor has a first electrode coupled to the first clock line, and a second electrode coupled to the first electrode. The fifth transistor has a first electrode coupled to a second electrode of the fourth transistor, and a second electrode coupled to the second electrode of the first transistor. The sixth transistor has a first electrode coupled to the second clock signal, and a second electrode coupled to the first electrode. The seventh transistor has a first electrode coupled to a second electrode of the sixth transistor, and a second electrode coupled to the second electrode of the second transistor.

Since the second electrode of the first transistor is connected to the first clock line and the second electrode of the second transistor is fed with the second clock line, potential on the second electrodes of the first transistor and the second transistor can alternated, preventing from stress applied on the second electrodes of the first transistor and the second transistor which is caused by the second electrodes of the first transistor and the second transistor keeping at the same potential for a long time period. Accordingly, the GOA circuit reliability is enhanced.

It should be noted that, referring to FIG. 4, the first clock signal indicates the (N+2)th clock signal CK(N+2) and the second clock signal indicates the (N−2)th clock signal CK(N−2). The fourth transistor indicates the third thin film transistor T12. The fifth transistor indicates the fourth thin film transistor T13. The sixth transistor indicates the fifth thin film transistor T14. The seventh transistor indicates the sixth thin film transistor T15.

In one embodiment, the Nth stage GOA unit further comprises a low voltage level line, an eighth transistor, a ninth transistor, and a tenth transistor. The low voltage level line is configured to transmit a low voltage level signal. The eighth transistor includes a first electrode coupled to the high voltage level line. The ninth transistor includes a gate coupled to a second electrode of the eighth transistor, a first electrode coupled to the low voltage level line, and a second electrode coupled to the Nth stage scan line. The tenth transistor includes a gate coupled to the second electrode of the first transistor, a first electrode coupled to the low voltage level signal, and a second electrode coupled to the gate of the ninth transistor.

Since the second electrode of the first transistor is connected to the eighth transistor, potential on the second electrode of the eighth transistor can alternated, preventing from stress applied on the second electrode of the eighth transistor which is caused by the second electrode of the eighth transistor keeping at the same potential for a long time period. Accordingly, the GOA circuit reliability is enhanced.

It should be noted that, referring to FIG. 4, the eighth transistor indicates the eighth thin film transistor T4. The ninth transistor indicates the ninth thin film transistor T9 The tenth transistor indicates the tenth thin film transistor T6.

In one embodiment, the Nth stage GOA unit further comprises an eleventh transistor. The eleventh transistor includes a first electrode coupled to the low voltage level line, a second electrode coupled to the second electrode of the first transistor, and a gate coupled to the second of the tenth transistor.

Since the second electrode of the first transistor is connected to the eleventh transistor, potential on the second electrode of the eleventh transistor can alternated, preventing from stress applied on the second electrode of the eleventh transistor which is caused by the second electrode of the eleventh transistor keeping at the same potential for a long time period. Accordingly, the GOA circuit reliability is enhanced.

It should be noted that, referring to FIG. 4, the eleventh transistor indicates the eleventh thin film transistor T5.

In one embodiment, the Nth stage GOA unit further comprises a twelfth transistor, having a first electrode coupled to the low voltage level line, and a second electrode coupled to the second electrode of the first transistor.

Since the second electrode of the first transistor is connected to the twelfth transistor, potential on the second electrode of the twelfth transistor can alternated, preventing from stress applied on the second electrode of the twelfth transistor which is caused by the second electrode of the twelfth transistor keeping at the same potential for a long time period. Accordingly, the GOA circuit reliability is enhanced.

It should be noted that, referring to FIG. 4, the twelfth transistor indicates the twelfth thin film transistor T3.

In one embodiment, the Nth stage GOA unit further comprises a first scan line, a second scan line, a forward scan control line, a backward scan control line, a third clock line, and a fourth clock line. The first scan line is coupled to the gate of the first transistor and configured to transmit a first scan signal. The second scan line is coupled to the gate of the second transistor and configured to transmit a second scan signal. The forward scan control line is coupled to a gate of the fifth transistor and configured to transmit a forward scan control signal. The backward scan control line is coupled to a gate of the seventh transistor and configured to transmit a backward scan control signal. The third clock line is coupled to a second electrode of the third transistor and configured to transmit a third clock signal. The fourth clock line is coupled to a gate of the eighth transistor and a gate of the twelfth transistor, and configured to transmit a fourth clock signal.

It should be noted that, referring to FIG. 4, the first scan signal indicates the (N−2)th stage scan signal G(N−2). The second scan signal indicates the (N+2)th stage scan signal G(N+2). The third clock signal indicates the Nth clock signal CK(N) and the fourth clock signal indicates the (N+4)th clock signal CK(N+4).

In one embodiment, the Nth stage GOA unit further comprises a thirteenth transistor, having a gate coupled to the high voltage level line, a first electrode coupled to a second electrode of the first transistor, and a second electrode.

It will be appreciated that, the thirteenth transistor is conducive to maintain the potential of the second electrode of the first transistor and the potential of the gate of the, third transistor gate.

It should be noted that, referring to FIG. 4, the thirteenth transistor indicates the thirteenth thin film transistor T7.

In one of the embodiments, all the thin film transistors T1-T15 are N-channel type thin film transistors or P-channel type thin film transistors.

In another embodiment, a display panel includes a GOA circuit as provided by any one of the above embodiments.

The GOA circuit of the present disclosure is fed with a high-potential signal through the input end of the pull-up control circuit 10, which can alleviate the failure of the GOA circuit, thereby improving the reliability of the GOA circuit. At the same time, the scanning direction control circuit 30 can be controlled by the clock signal to realize the alternating forward and backward scanning. Since the output end of the scanning direction control circuit 30 is connected with the output end of the pull-up control circuit 10, the potential applied on the output end of the pull-up control circuit 10 can be alternately changed to relieve the stress caused by the output end of the pull-up control circuit 10 maintaining the same potential for a long time, further improving the reliability of the GOA circuit.

In another embodiment, a working stage of the display panel includes a row scanning stage that includes a touch scanning stage. The GOA circuit works in the row scanning stage and the touch scanning stage in a time-sharing manner.

It is noted that during the row scanning stage for scanning rows of pixels, there will be a pause scanning period is inserted into two row scanning periods for touch scanning stage. After a touch scanning period is between two row scanning period.

In particular, for In-cell touch screen technology, part of touch electrode can be scanned for a time period that scanning rows of pixels of the display area (AA) of the display is paused.

Figure 6:
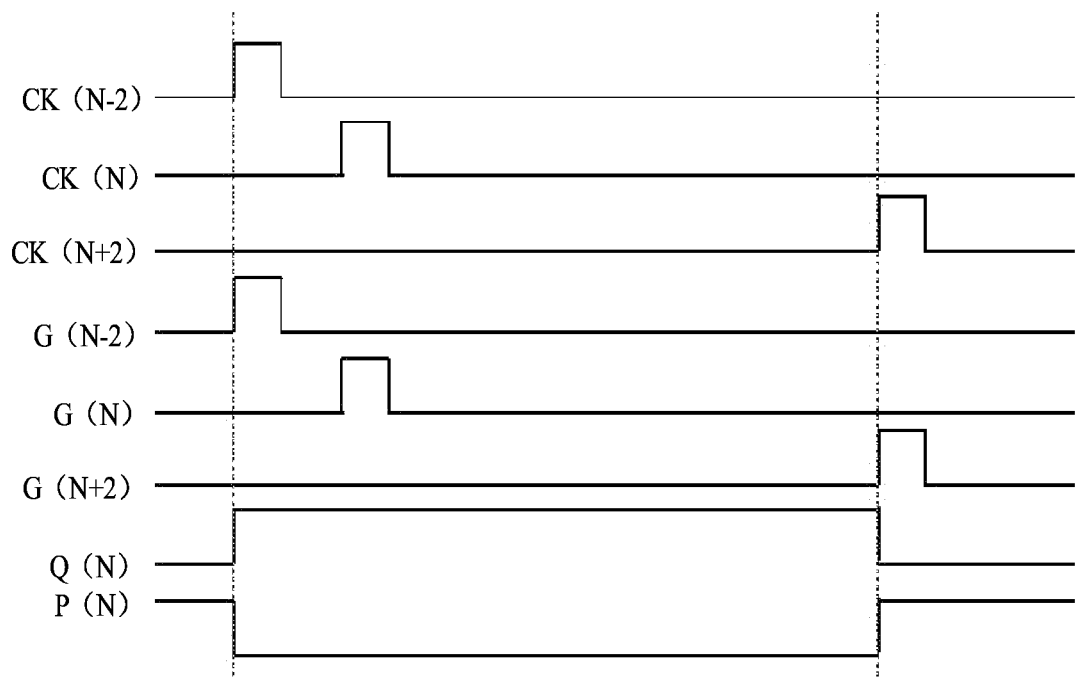
FIG. 6 illustrates another timing diagram of signals applied on the GOA circuit shown in FIG. 4.

For example, FIG. 6 illustrates waveforms of the (N−2)th clock signal CK (N−2), the Nth clock signal CK(N), the (N+2)th clock signal, the CK(N−2), the (N−2)th scan signal G(N−2), and the Nth scan signal G(N), the (N+2)th scan signal G (N+2), the node Q (N) and the node P (N).

Specifically, when the display panel needs to perform touch scanning, the GOA circuit can be controlled by the corresponding clock signal to stop the display scanning. For example, after the Nth GOA unit outputs the Nth scan signal G(N), the display panel enters the Touch Panel (TP) suspending period that the display scan stops and touch scan starts. During the touch Panel (TP) suspending period, the GOA circuit stops outputting to stop display scan by no pulse of the clock signal fed to the GOA circuit. At the same time, the global pull-down signal GAS2 is transitioned from a low voltage level to the high voltage, the global pull-down module 130, i.e. the fifteenth thin film transistor T11, is turned on, so that each scan signal output by the GOA circuit is at low voltage level. When the touch scan ends, the (N+2)th clock signal resumes to output pulses to trigger the GOA unit to output scan signal for normal display scanning.

It is noted that, because the touch Panel (TP) suspending period is a long time period, the potential of the key nodes Q(N) and P(N) may be maintained at the same potential for the long time period. Therefore, the GOA circuit and display panel provided in this embodiment can improve the leakage and reliability.

Specifically, the bias voltage and temperature stress of thin film transistors will be more obvious during an aging test performed in an environment with a temperature of 85 □ and a humidity of 85%. The environmental condition of temperature of 85 □ and humidity of 85% is worse than that of normal temperature and normal humidity. Under the test, the GOA circuit and display panel provided in this embodiment can improve the leakage and reliability.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A Gate Driver on Array (GOA) circuit, comprising a plurality of cascaded GOA units, an Nth stage GOA unit comprising:
   a high voltage level line, configured to transmit high voltage level signal;
   an Nth stage scan line, configured to transmit an Nth stage scan signal;
   a first transistor, having a first electrode coupled to the high voltage level line;
   a second transistor, having a first electrode coupled to the high voltage level line;
   a third transistor, having a gate coupled to a second electrode of the first transistor and a second electrode of the second transistor, and a first electrode coupled to the Nth stage scan line;
   a first clock line, configured to transmit a first clock signal;
   a second clock line, configured to transmit a second clock signal;
   a fourth transistor, having a first electrode coupled to the first clock line, and a gate coupled to the first electrode;
   a fifth transistor, having a first electrode coupled to a second electrode of the fourth transistor, and a second electrode coupled to the second electrode of the first transistor;
   a sixth transistor, having a first electrode coupled to the second clock signal, and a gate electrode coupled to the first electrode; and
   a seventh transistor, having a first electrode coupled to a second electrode of the sixth transistor, and a second electrode coupled to the second electrode of the second transistor.

2. The GOA circuit as claimed in claim 1, wherein the Nth stage GOA unit further comprises:
- a low voltage level line, configured to transmit a low voltage level signal;
- an eighth transistor, having a first electrode coupled to the high voltage level line;
- a ninth transistor, having a gate coupled to a second electrode of the eighth transistor, a first electrode coupled to the low voltage level line, and a second electrode coupled to the Nth stage scan line; and
- a tenth transistor, having a gate coupled to the second electrode of the first transistor, a first electrode coupled to the low voltage level signal, and a second electrode coupled to the gate of the ninth transistor.

3. The GOA circuit as claimed in claim 2, wherein the Nth stage GOA unit further comprises:
- an eleventh transistor, having a first electrode coupled to the low voltage level line, a second electrode coupled to the second electrode of the first transistor, and a gate coupled to the second of the tenth transistor.

4. The GOA circuit as claimed in claim 3, wherein the Nth stage GOA unit further comprises:
- a twelfth transistor, having a first electrode coupled to the low voltage level line, and a second electrode coupled to the second electrode of the first transistor.

5. The GOA circuit as claimed in claim 4, wherein the Nth stage GOA unit further comprises:
- a first scan line, coupled to the gate of the first transistor and configured to transmit a first scan signal;
- a second scan line, coupled to the gate of the second transistor and configured to transmit a second scan signal;
- a forward scan control line, coupled to a gate of the fifth transistor and configured to transmit a forward scan control signal;
- a backward scan control line, coupled to a gate of the seventh transistor and configured to transmit a backward scan control signal;
- a third clock line, coupled to a second electrode of the third transistor and configured to transmit a third clock signal; and
- a fourth clock line, coupled to a gate of the eighth transistor and a gate of the twelfth transistor, and configured to transmit a fourth clock signal.

6. The GOA circuit as claimed in claim 1, wherein the Nth stage GOA unit further comprises:
- a thirteenth transistor, having a gate coupled to the high voltage level line, a first electrode coupled to a second electrode of the first transistor, and a second electrode.

7. A Gate Driver on Array (GOA) circuit, comprising a plurality of cascaded GOA units, an Nth stage GOA unit comprising:
- a pull-up control circuit, having an input end fed with a high voltage level signal, and a control end fed with an (N−2)th stage scan signal and an (N+2)th stage scan signal;
- a pull-up output circuit, having a control end coupled to an output end of the pull-up control circuit, an input end coupled to an Nth stage clock signal, and an output end outputting coupled to an Nth stage scan signal; and
- a scan direction control circuit, having an input end fed with an (N−2)th stage clock signal and an (N+2)th stage clock signal, an output end coupled to the control end of the pull-up control circuit, and a control end fed with a forward scan control signal, a backward scan control signal, the (N−2)th stage clock signal and the (N+2)th stage clock signal.

8. The GOA circuit as claimed in claim 7, wherein the Nth stage GOA unit further comprises:
- a pull-down control circuit, having an input end fed with the high voltage level signal, and a control end fed with an (N+4)th stage clock signal; and
- a pull-down output circuit, having a control end coupled to the control end of the pull-down control circuit, an input end fed with a low voltage level signal, and an output end coupled to the output end of the pull-up output circuit.

9. The GOA circuit as claimed in claim 8, wherein the Nth stage GOA unit further comprises:
- a first pull-down circuit, having an input end fed with the low voltage level signal, a control end coupled to an output end of the pull-up control circuit, and an output end coupled to an output end of the pull-down control circuit.

10. The GOA circuit as claimed in claim 9, wherein the Nth stage GOA unit further comprises:
- a second pull-down circuit, having an input end fed with the low voltage level signal, an output end coupled to the output end of the pull-up control circuit, and a control end coupled to the output end of the pull-down control circuit.

11. The GOA circuit as claimed in claim 10, wherein the Nth stage GOA unit further comprises:
- a third pull-down circuit, having an input end fed with the low voltage level signal, an output end coupled to the output end of the pull-up control circuit, and a control end coupled to the (N+4)th stage clock signal.

12. The GOA circuit as claimed in claim 8, wherein the Nth stage GOA unit further comprises:
- a first voltage stabilizing circuit, coupled to the output end of the pull-up control circuit and fed with the low voltage level signal; and
- a second voltage stabilizing circuit, coupled to the output end of the pull-down control circuit and fed with the low voltage level signal.

13. The GOA circuit as claimed in claim 7, wherein the Nth stage GOA unit further comprises:
- a third voltage stabilizing circuit, having an input end coupled to the output end of the pull-up control circuit, a control end fed with the high voltage level signal, and an output end coupled to the output end of the pull-up output circuit; or
- a global pull-up circuit, having an input end fed with an global pull-up signal, a control end fed with the global pull-up signal, and an output end coupled to the output end of pull-up output circuit; or
- a global pull-down circuit, having an input end fed with the low voltage level signal, a control end fed with the global pull-down signal, and an output end coupled to the output end of pull-up output circuit.

14. The GOA circuit as claimed in claim 7, wherein the pull-up control circuit comprises:
- a first thin film transistor, having a first electrode fed with the high voltage level signal, and a gate fed with the (N−2)th stage scan signal; and
- a second thin film transistor, having a first electrode fed with the high voltage level signal, a gate fed with the (N+2)th stage scan signal, and a second electrode coupled to a second electrode of the first thin film transistor and the output end of the scan direction control circuit.

15. The GOA circuit as claimed in claim 7, wherein the scan direction control circuit comprises:

a forward scan control circuit, having an input end fed with the (N+2)th stage clock signal, and a control end fed with the (N+2)th stage clock signal and the forward scan control signal; and a backward scan control circuit, having an input end fed with the (N−2)th stage clock signal, a control end fed with the (N−2)th stage clock signal and the backward scan control signal, and an output end coupled to an output end of the forward scan control circuit and the control end of the pull-up control circuit.

16. The GOA circuit as claimed in claim 15, wherein the forward scan control circuit comprises:

a third thin film transistor, having a first electrode fed with the (N+2)th stage clock signal, and a gate fed with the (N+2)th stage clock signal; and a fourth thin film transistor, having a first electrode coupled to a second electrode of the third thin film transistor, a gate fed with the forward scan control signal, and a second electrode coupled to the output end of the pull-up control circuit; and wherein the backward scan control circuit comprises:

a fifth thin film transistor, having a first electrode fed with the (N−2)th stage clock signal, and a gate fed with the (N−2)th stage clock signal; and a sixth thin film transistor, having a first electrode coupled to a second electrode of the fifth thin film transistor, a gate fed with the backward scan control signal, and a second electrode coupled to the output end of the pull-up control circuit.

17. The GOA circuit as claimed in claim 16, wherein the pull-up output circuit comprises: a seventh thin film transistor, having a gate coupled to the second electrode of the fourth thin film transistor or the second electrode of the sixth thin film transistor, a first electrode fed with an Nth clock signal, and a second electrode outputting the Nth scan signal.

18. A display panel comprising the GOA circuit as claimed in claim 1.

19. The display panel as claimed in claim 18, wherein a working stage of the display panel includes a row scanning stage that includes a touch scanning stage; and the GOA circuit works in the row scanning stage and the touch scanning stage in a time-sharing manner.

* * * * *